United States Patent [19]
Salters et al.

[11] 4,298,811
[45] Nov. 3, 1981

[54] MOS VOLTAGE DIVIDER

[75] Inventors: Roelof H. W. Salters, Cupertino; Joannes J. M. Koomen, Los Altos, both of Calif.

[73] Assignee: Signetics Corporation, Sunnyvale, Calif.

[21] Appl. No.: 59,228

[22] Filed: Jul. 20, 1979

[51] Int. Cl.$^3$ .............................................. H03K 3/01
[52] U.S. Cl. .............................. 307/296 R; 307/304; 323/22
[58] Field of Search ................... 307/270, 304, 296 R; 323/4, 9, 22

[56] References Cited

U.S. PATENT DOCUMENTS

| | | | |
|---|---|---|---|
| 3,806,742 | 4/1974 | Powell | 307/304 |
| 4,008,406 | 2/1977 | Kawagoe | 307/304 |
| 4,038,563 | 7/1977 | Zuleeg | 307/304 |
| 4,069,430 | 1/1978 | Masuda | 307/270 |
| 4,152,716 | 5/1979 | Torii | 307/296 R |

Primary Examiner—Harold A. Dixon
Attorney, Agent, or Firm—Jerry A. Dinardo; Thomas A. Briody; Jack Oisher

[57] ABSTRACT

A simple MOS voltage divider uses three enhancement MOS transistors, which includes one load connected to two drivers in parallel. The gate of one driver is connected to the output node, and the other two gates are connected to the supply voltage. The transistors have a common substrate.

By proper choice of the transistor geometry only, the output node voltage can be made independent of the threshold and temperature variations for output voltages larger than one threshold and smaller than one-half the supply voltage. Moreover, the ratio between the output and supply voltages remains constant.

3 Claims, 1 Drawing Figure

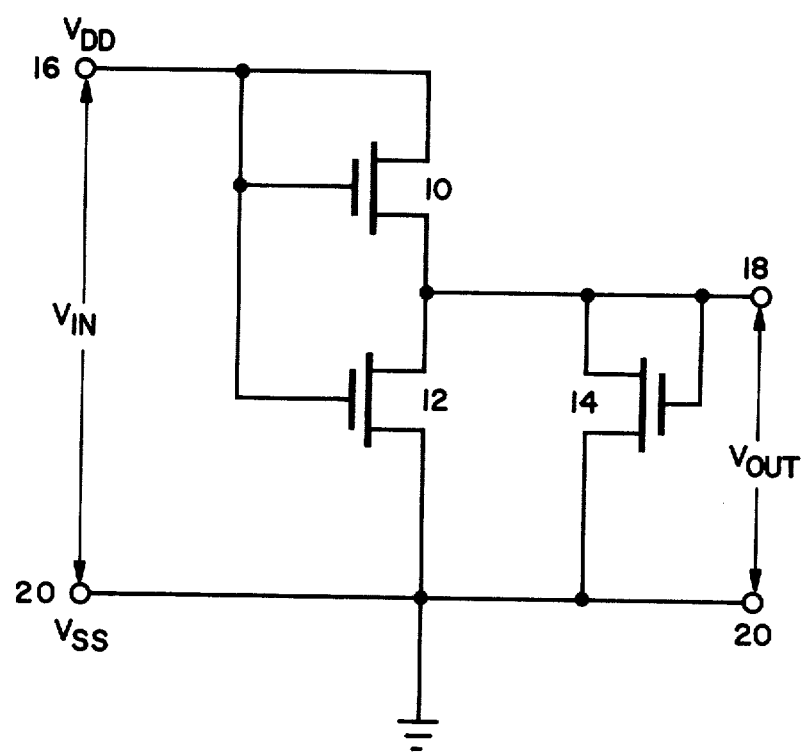

MOS VOLTAGE DIVIDER

BACKGROUND OF THE INVENTION

The invention relates to MOS voltage divider circuits and particularly to an improved voltage divider in which threshold voltage and ambient temperature variations have little influence on the output voltage.

MOS voltage dividers are in wide use, for instance as reference voltage generators for the differential amplifier type input buffers on 4K and 16K dynamic RAMS (random access memories). The term MOS is shortened from the abbreviation MOSFET, which means metal oxide semiconductor field effect transistor. Generally, these voltage generators require many transistors in series, thereby causing many threshold voltage drops, which in turn is acceptable only with relatively high input voltages.

U.S. Pat. No. 4,069,430 to Masuda, issued Jan. 17, 1978, discloses a MOS voltage divider circuit having both enhancement and depletion type transistors all connected in series. German patent application No. 2,435,606 published June 22, 1968, discloses two depletion type transistors connected in series. U.S. Pat. No. 4,152,716 to Torii et al, issued May 1, 1979, discloses a plurality of enhancement type transistors all connected in series.

SUMMARY OF THE INVENTION

In accordance with the invention a voltage divider circuit comprises an input node, an output node, a common node, and three field effect transistors coupled to the three nodes. A first and second one of the three field effect transistors are connected in parallel, with their respective drain and source electrodes connected in common across the output and the common nodes. The third field effect transistor is connected directly across the input and the output nodes so that it is in series with the parallel connected first and second field effect transistors. When a dc voltage is applied across the input and common nodes, a reduced dc voltage appears across the output and common nodes.

The output voltage is very stable with respect to threshold voltage variations. When enhancement type transistors are used, the voltage divider circuit performs well down to a supply voltage as small as two thresholds.

Threshold voltage variations can be attributed to several different sources. Differences in processing conditions can cause a transistor in a device processed at a given time to have a different threshold voltage from a transistor in a device processed at a different time. During operation of a given device, temperature changes can cause the threshold voltage to vary. Also during operation of the device, a variation in the substrate bias voltage can result in a change in the threshold voltage.

In addition to its simplicity the voltage divider circuit of the invention produces a very stable output voltage. By proper choice of the transistor geometry only, the output node voltage can be made independent of threshold and temperature variations for output voltages greater than one threshold and smaller than one-half the input supply voltage. Moreover the ratio between the output and input supply voltages remains constant.

BRIEF DESCRIPTION OF THE DRAWING

FIG. 1 is a schematic diagram of a voltage divider circuit constructed according to the invention.

DESCRIPTION OF THE PREFERRED EMBODIMENT

Referring now to the single figure of the drawing, there is shown a MOS voltage divider circuit according to the invention. The circuit includes three MOS transistors 10, 12, 14, coupled to three nodes 16, 18, 20. Hereinafter, node 16 will be referred to as the input node, node 18 will be referred to as the output node, and node 20 will be referred to as the common node, shown grounded. The input node 16 is connected to the drain supply voltage $V_{DD}$, and the common node 20 is connected to the source supply voltage $V_{SS}$.

The transistors 10 and 12 are connected in series across the input node 16 and common node 20. The drain of transistor 10 is connected to the input node 16. The source of transistor 10 and the drain of transistor 12 are connected together and to the output node 18. The source of transistor 12 is connected to the common node 20. The gates of transistors 10 and 12 are connected together and to the input node 16.

The transistor 14 is connected in parallel with the transistor 12 across the output node 18 and common node 20, with the drains of the transistors 12 and 14 connected to the output node 18 and the sources thereof connected to the common node 20. The gate of transistor 14 is connected to the drain thereof and to the output node 18.

All of the transistors 10, 12, 14 are of one type, and it is preferred that they all be enhancement type. An enhancement type transistor is non-conducting as long as the gate potential is below a threshold level above the source potential, and it will conduct when the gate potential exceeds the threshold level. While the circuit will operate with all of the transistors being of the depletion type, it is preferred to use enhancement type transistors because of their better reproducibility. In any event, the circuit must not include both enhancement and depletion types together.

Because the gates of all of transistors 10, 12, 14 are connected to a high potential, the transistors are conducting and the input drain supply voltage $V_{DD}$ at the input node 16 will divide in proportion to the resistance values of the transistors. Since the resistance value of a transistor is a function of its W/L ratio, it is also evident that the amount of voltage division desired can be adjusted by properly adjusting the W/L ratio of the transistors.

The $\beta$ of a MOS transistor is defined by the following relationship:

$\beta = \mu_0 C_0 W/L$, where $\mu_0$ is the carrier mobility in the channel, $C_0$ is the oxide capacitance per unit area, W is the width of the channel, and L is the length of the channel, or the distance between the source and drain. In the following mathematical analysis, $\beta_1$, $\beta_2$, $\beta_3$ are the $\beta$'s associated with transistors 10, 14 and 12 respectively, $V_T$ is the threshold voltage of the transistors, and $W_1$, $W_2$, $W_3$ are the respective widths of the transistors 10, 14, 12.

The current equations for the three transistors can be written as follows:

$$\frac{\beta_1}{2}(V_{in} - V_T - V_{out})^2 = \frac{\beta_2}{2}(V_{out} - V_T)^2 + \quad (1)$$
$$\beta_3\{(V_{in} - V_T)V_{out} - \tfrac{1}{2}V_{out}^2\}$$

Assuming equal channel length and process parameters for all transistors this reduces to:

$$W_1(V_{in} - V_T - V_{out})^2 = W_2(V_{out} - V_T)^2 + W_3\{2(V_{in} - V_T)V_{out} - V_{out}^2\} \quad (2)$$

Differentiating this equation with respect to $V_T$ gives:

$$2W_1(V_{in} - V_T - V_{out})\left(-1 - \frac{\partial V_{out}}{\partial V_T}\right) = \quad (3)$$
$$2W_2(V_{out} - V_T)\left(\frac{\partial V_{out}}{\partial V_T} - 1\right) +$$
$$W_3\left\{2(V_{in} - V_T)\frac{\partial V_{out}}{\partial V_T} - 2V_{out} - 2V_{out}\frac{\partial V_{out}}{\partial V_T}\right\}$$

Solving this equation for $\partial V_{out}/\partial V_T$ and putting this to 0 results in $$-2W_1(V_{in} - V_T - V_{out}) + 2W_2(V_{out} - V_T) + 2W_3 V_{out} = 0. \quad (4)$$

Together with equation (2) there are now two equations with variables $W_1$, $W_2$, and $W_3$. For a particular set of values for $V_{in}$, $V_T$ and $V_{out}$, $W_1$ and $W_2$ can be expressed as fractions of $W_3$. In a similar way, the following expression can be derived, which is valid as long as $V_T < V_{out} < V_{in}/2$:

$$\frac{\partial V_{out}}{\partial V_{in}} = \frac{V_{out}}{V_{in}}$$

For $V_{in} = 5V$, $V_T = 0.8V$, $V_{out} = 1.5V$, this gives $W_1 = 1.72W_3$; $W_2 = 4.5W_3$ where $W_3$ may be freely chosen, it being only determinative of the current level in the voltage divider. In this calculation the result of body effect on the threshold voltage of transistor 10 is neglected. It is quite complicated to include this in the mathematical analysis. Computer analysis can include this effect and yield slightly different values for $W_1/W_3$ and $W_2/W_3$.

The circuit according to the invention produces an output voltage that is a linear function of the input voltage and that is relatively insensitive to threshold voltage variations. Typically the variation in output voltage with threshold voltage is only about 10 millivolts per volt. The variation in output voltage with temperature is only about 65 microvolts per degree Kelvin.

What is claimed is:

1. A voltage divider circuit, comprising:
   (a) an input node, an output node, and a common node,
   (b) first and second field effect transistors connected in parallel and having their respective drain and source electrodes connected in common across said output node and said common node, and
   (c) a third field effect transistor connected directly across said input node and said output node and in series circuit with said parallel connected first and second field effect transistors across said input node and said common node, the gates of said first and third transistors being connected in common to said input node, and the gate of said second transistor being connected directly to said output node, said circuit producing a reduced dc voltage across said output node relative to dc voltage applied across said input node.

2. The invention according to claim 1, wherein said transistors are all enhancement type.

3. A voltage divider circuit, comprising:
   (a) an input node, an output node, and a common node;
   (b) a first field effect transistor having its drain connected directly to said output node, its source connected directly to said common node, and its gate connected directly to said input node;
   (c) a second field effect transistor having its drain and gate connected directly to said output node and its source connected directly to said common node; and
   (d) a third field effect transistor having its source connected directly to said output node and its drain and gate connected directly to said input node;
   said circuit being capable of producing a reduced dc output voltage across said output and common nodes relative to an input dc voltage applied across said input and common nodes.

* * * * *